United States Patent
Shin et al.

(10) Patent No.: US 7,755,943 B2
(45) Date of Patent: Jul. 13, 2010

(54) UNIT CELL BLOCK OF EEPROM AND SEMICONDUCTOR MEMORY DEVICE HAVING THE SAME

(75) Inventors: Chang-Hee Shin, Chungcheongbuk-do (KR); Ki-Seok Cho, Chungcheongbuk-do (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 110 days.

(21) Appl. No.: 12/068,314

(22) Filed: Feb. 5, 2008

(65) Prior Publication Data

US 2008/0186768 A1    Aug. 7, 2008

(30) Foreign Application Priority Data

Feb. 6, 2007    (KR) .................... 10-2007-0012095

(51) Int. Cl.
   *G11C 14/00*    (2006.01)
(52) U.S. Cl. ..................... 365/185.08; 365/185.18; 365/185.21; 365/185.28
(58) Field of Classification Search ............ 365/185.08, 365/185.18, 185.21, 185.28
   See application file for complete search history.

(56) References Cited

U.S. PATENT DOCUMENTS

| 4,748,593 | A |   | 5/1988 | Topich et al. |
| 5,440,508 | A |   | 8/1995 | Pathak et al. |
| 5,523,971 | A |   | 6/1996 | Rao |
| 5,566,110 | A | * | 10/1996 | Soenen et al. .......... 365/185.07 |
| 5,757,696 | A | * | 5/1998 | Matsuo et al. ......... 365/185.07 |
| 6,411,545 | B1 | * | 6/2002 | Caywood ............... 365/185.07 |
| 2005/0169054 | A1 | * | 8/2005 | Forbes ................... 365/185.08 |

FOREIGN PATENT DOCUMENTS

| KR | 1996-0012029 | 4/1996 |
| KR | 1999-004899 | 1/1999 |
| KR | 10-2004-0082534 | 9/2004 |

* cited by examiner

*Primary Examiner*—Hoai V Ho
(74) *Attorney, Agent, or Firm*—Morgan Lewis & Bockius LLP

(57) ABSTRACT

A semiconductor memory device is capable of reading data at a high speed, without using a reference cell transistor. The semiconductor memory device includes a sensing unit including first cross-coupled MOS transistors to sense and amplify a voltage difference between a first node and a second node, and a unit cell including second cross-coupled cell MOS transistors to latch data and output a first signal and a second signal corresponding to the latched data to the first node and the second node, respectively.

11 Claims, 3 Drawing Sheets

| MODE \ TERMINAL | | SOURCE | DRAIN | GATE |
|---|---|---|---|---|
| PROGRAM | WRITE | FLOATING | 19V | GND |
| | ERASE | FLOATING | GND | 19V |
| READ | | GND | 1.2V | 1.2V |

UNIT CELL BLOCK OF EEPROM AND SEMICONDUCTOR MEMORY DEVICE HAVING THE SAME

CROSS-REFERENCE TO RELATED APPLICATIONS

The present invention claims priority to Korean patent application number 10-2007-0012095, filed on Feb. 6, 2007, which is incorporated by reference in its entirety.

BACKGROUND OF THE INVENTION

The present invention relates to a semiconductor memory device, and more particularly to an electrically erasable and programmable read-only memory (EEPROM).

An EEPROM is a semiconductor memory device for storing data. Semiconductor memory devices are classified into volatile memories and non-volatile memories according to whether stored data is retained even when a power is interrupted. Examples of the volatile memories include dynamic random access memory (DRAM) and static RAM (SRAM), and examples of the non-volatile memories include flash memory, erasable and programmable read-only memory (EPROM), EEPROM, and mask ROM. The EPROM erases stored data using ultraviolet light, which causes inconvenience in storing and erasing data. The EEPROM electrically erases stored data, which makes it easier to store, retain and erase data as compared to the EPROM. For this reason, the EEPROM is being widely used.

FIG. 1 is a schematic circuit diagram illustrating a cell block of a conventional semiconductor memory device. Particularly, a cell block of an EEPROM is described.

Referring to FIG. 1, the conventional EEPROM includes a memory cell 10, a sensing unit 20, and sensing enable control units 30 and 40. The memory cell 10 includes a unit cell transistor MREC for storing data, and a reference cell transistor MREF for storing reference data. A first sensing enable control unit 30 includes a first enable transistor T1 and a first biasing transistor T2. The first enable transistor T1 is turned on in response to an enable signal ENABLE. The first biasing transistor T2 supplies a predetermined bias voltage to an input terminal of the sensing unit 20. A second sensing enable control unit 40 includes a second enable transistor T3 and a second biasing transistor T4. The second enable transistor T3 is turned on in response to the enable signal ENABLE. The second biasing transistor T4 supplies a predetermined bias voltage to another input terminal of the sensing unit 20.

The unit cell transistor MREC has different threshold voltages, respectively, when stored data is 0 and 1. The reference cell transistor MREF has a threshold voltage in the range between the threshold voltage of the unit cell transistor MREC when data is 0, and the threshold voltage of the unit cell transistor MREC when data is 1. When the reference cell transistor MREF is turned on in response to the input of a read signal READ, the unit cell transistor MREC maintains a turned-on state or a turned-off state according to whether the data stored in the unit cell transistor MREC is 0 or 1.

In the sensing unit 20, two transistors T7 and T8 compare a signal from the reference transistor MREF with a signal from the unit cell transistor MREC, and a comparison result signal VOUT is output. If a threshold voltage of the unit cell transistor MREC is higher than that of the reference cell transistor MREF, the unit cell transistor MREC is not turned on and thus the sensing unit 20 outputs the comparison result signal VOUT having a logic high level. If the threshold voltage of the unit cell transistor MREC is lower than that of the reference cell transistor MPREF, the unit cell transistor MREC is turned on and thus the sensing unit 20 outputs the comparison result signal VOUT having a logic low level.

As described above, the conventional EEPROM requires the reference cell transistor MPREF for a data read operation, and a data access time increases by the time necessary for the sensing unit 20 to perform the comparison operation.

Also, as the level of the power voltage used in the memory device is lowered, a difference between the threshold voltage of the unit cell transistor MREC and the threshold voltage of the reference cell transistor MPREF decreases. Accordingly, a time required for the sensing operation of the sensing unit 20 increases. Furthermore, because the sensing unit 20 includes a differential amplifier, current consumption increases in the sensing operation.

SUMMARY OF THE INVENTION

An embodiment of the present invention is directed to providing an EEPROM capable of reading data at a high speed, without using a reference cell transistor.

In accordance with an aspect of the present invention, there is provided a semiconductor memory device includes a sensing unit including first cross-coupled MOS transistors to sense and amplify a voltage difference between a first node and a second node, and a unit cell including second cross-coupled cell MOS transistors to latch data and output a first signal and a second signal corresponding to the latched data to the first node and the second node, respectively.

In accordance with another aspect of the present invention, there is provided a semiconductor memory device includes a sensing unit including first cross-coupled MOS transistors to sense and amplify a voltage difference between a first node and a second node, a unit cell including second cross-coupled cell MOS transistors to latch data and output a first signal and a second signal corresponding to the latched data to a third node and a fourth node respectively, a sensing protecting unit disposed between the sensing unit and the unit cell to protect the first cross-coupled MOS transistors of the sensing unit and output the signals applied to the third node and the fourth node to the first node and the second node respectively, an enabling unit configured to enable the unit cell in response to a read signal, a data transfer unit configured to transfer data signals, and a programming control unit configured to supply a voltage corresponding to the data signals transferred from the data transfer unit to the third node and the fourth node.

DESCRIPTION OF SPECIFIC EMBODIMENTS

Hereinafter, a semiconductor memory device in accordance with the present invention will be described in detail with reference to the accompanying drawings.

Figure 1:
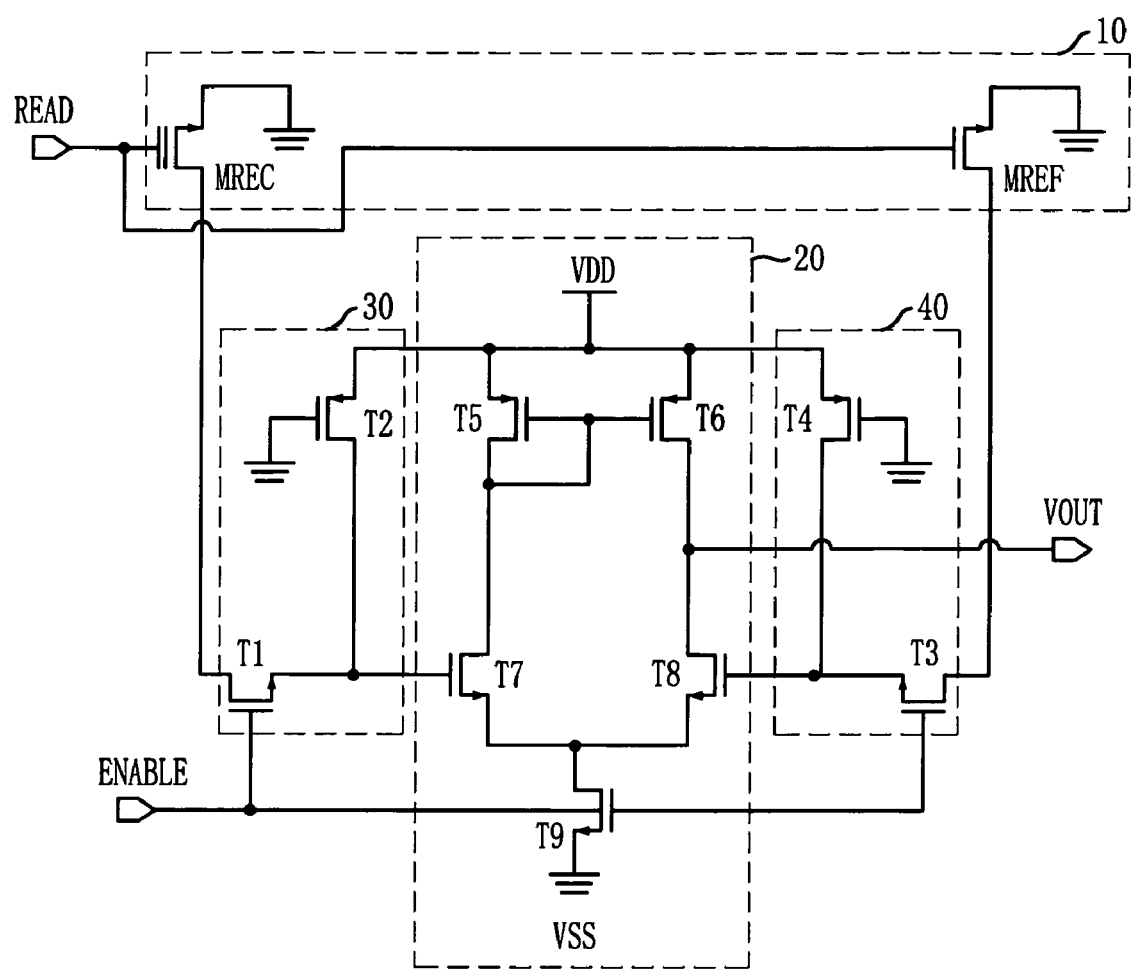
FIG. 1 is a schematic circuit diagram illustrating a cell block of a conventional semiconductor memory device.
Figures 2, 3:
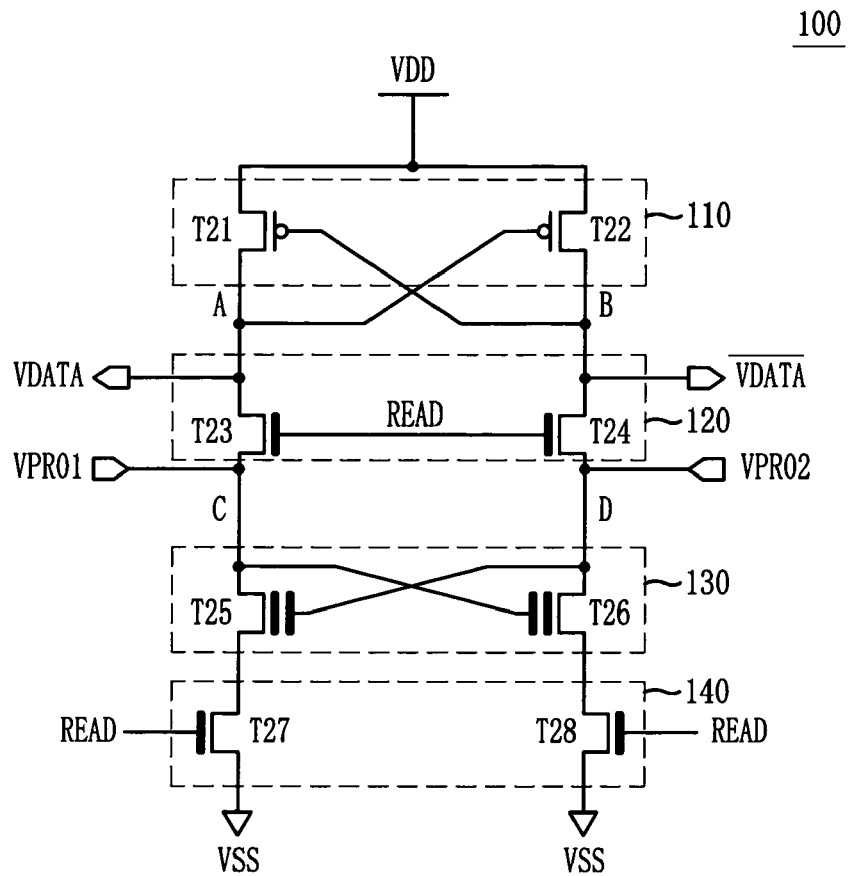
FIG. 2 is a schematic circuit diagram illustrating a unit cell block of a semiconductor memory device in accordance with an embodiment of the present invention.
FIG. 3 is a table illustrating operations of the semiconductor memory device of FIG. 2.

FIG. 2 is a schematic circuit diagram illustrating a unit cell block 100 of a semiconductor memory device in accordance with an embodiment of the present invention.

Referring to FIG. 2, the unit cell block 100 includes a sensing unit 110, a sensing protecting unit 120, a unit cell 130, and an enabling unit 140. The sensing unit 110 includes two cross-coupled MOS transistors T21 and T22 to sense and amplify a voltage difference between nodes A and B. In the sensing unit 110, the first MOS transistor T21 has one terminal connected to a power supply voltage terminal VDD, a gate connected to the node B, and the other terminal connected to the node A. The second MOS transistor T22 has one terminal connected to the power supply voltage terminal VDD, a gate connected to the node A, and the other terminal connected to the node B.

The unit cell 130 latches data using two cross-coupled MOS transistors T25 and T26, and transfers first and second signals corresponding to the latched data to nodes C and D. In the unit cell 130, the third MOS transistor T25 has one terminal connected to the node C and a gate connected to the node D, and the fourth MOS transistor T26 has one terminal connected to the node D and a gate connected to the node C. The MOS transistors T25 and T26 of the unit cell 130 are more resistant at a high voltage than the MOS transistors T21 and T22 of the sensing unit 120.

This is because a high voltage is applied to the unit cell 130 in order to change threshold voltages of the MOS transistors of the unit cell 130. Normal MOS transistors are used as the MOS transistors of the sensing unit 110 in order for high speed sensing operation. Therefore, the sensing protecting unit 120 is provided for protecting the MOS transistors of the sensing unit 110 when a high voltage is applied to the MOS transistors of the unit cell 130. The sensing protecting unit 120 includes a fifth MOS transistor T23 and a sixth MOS transistor T24. The fifth MOS transistor T23 has a gate receiving a read signal READ and is disposed between the node A and the node C to connect the sensing unit 110 to the unit cell 130. The sixth MOS transistor T24 has a gate receiving a read signal READ and is disposed between the node B and the node D to connect the sensing unit 110 to the unit cell 130.

The enabling unit 140 operates in response to the read signal READ to enable the unit cell 130. The enabling unit 140 includes a seventh MOS transistor T27 and an eighth MOS transistor T28. The seventh MOS transistor T27 is disposed between a ground voltage terminal VSS and one (e.g., T25) of the two cross-coupled MOS transistors T25 and T26. The eighth MOS transistor T28 is disposed between the ground voltage terminal VSS and the other T26 of the two cross-coupled MOS transistors T25 and T26. The MOS transistors T23 to T28 are more resistant at a high voltage than the MOS transistors T21 and T22.

In the semiconductor memory device, e. i., an EEPORM, illustrated in FIG. 2, data is stored by the cross-coupled MOS transistors T25 and T26, and the stored data is sensed by the cross-coupled MOS transistors T21 and T22. The cross-coupled MOS transistors T25 and T26 have different threshold voltages. Accordingly, when the read signal READ is activated, voltage levels of the nodes C and D respectively connected to the MOS transistors T25 and T26 become different. The voltage difference between the nodes C and D makes an identical level of a voltage difference between the nodes A and B. The MOS transistors T21 and T22 of the sensing unit 110 sense and amplify the voltage difference between the nodes A and B. Levels of output signals VDATA and /VDATA are determined depending on which of the MOS transistors T21 and T22 has a higher threshold voltage. Bias voltages VPR01 and VPR02 are signals for providing an operation biasing level of the unit cell 130.

FIG. 3 is a table showing operations of the semiconductor memory device of FIG. 2. Specifically, the table of FIG. 3 shows voltage levels applied to gates, sources and drains of the MOS transistors of the unit cell illustrated in FIG. 2.

A programming operation for shifting threshold voltages of the MOS transistors T25 and T26 of the unit cell 130 will now be described with reference to the table of FIG. 3. During the programming operation, the MOS transistors T25 and T26 operates in an opposite mode to each other. A write mode is to decrease the threshold voltages of a corresponding MOS transistor, and an erase mode is to increase the threshold voltages of the MOS transistor. A read operation is to detect a threshold voltage difference between the two MOS transistors T25 and T26 of the unit cell 130 and read data corresponding to the sensed threshold voltage difference.

Figure 4:
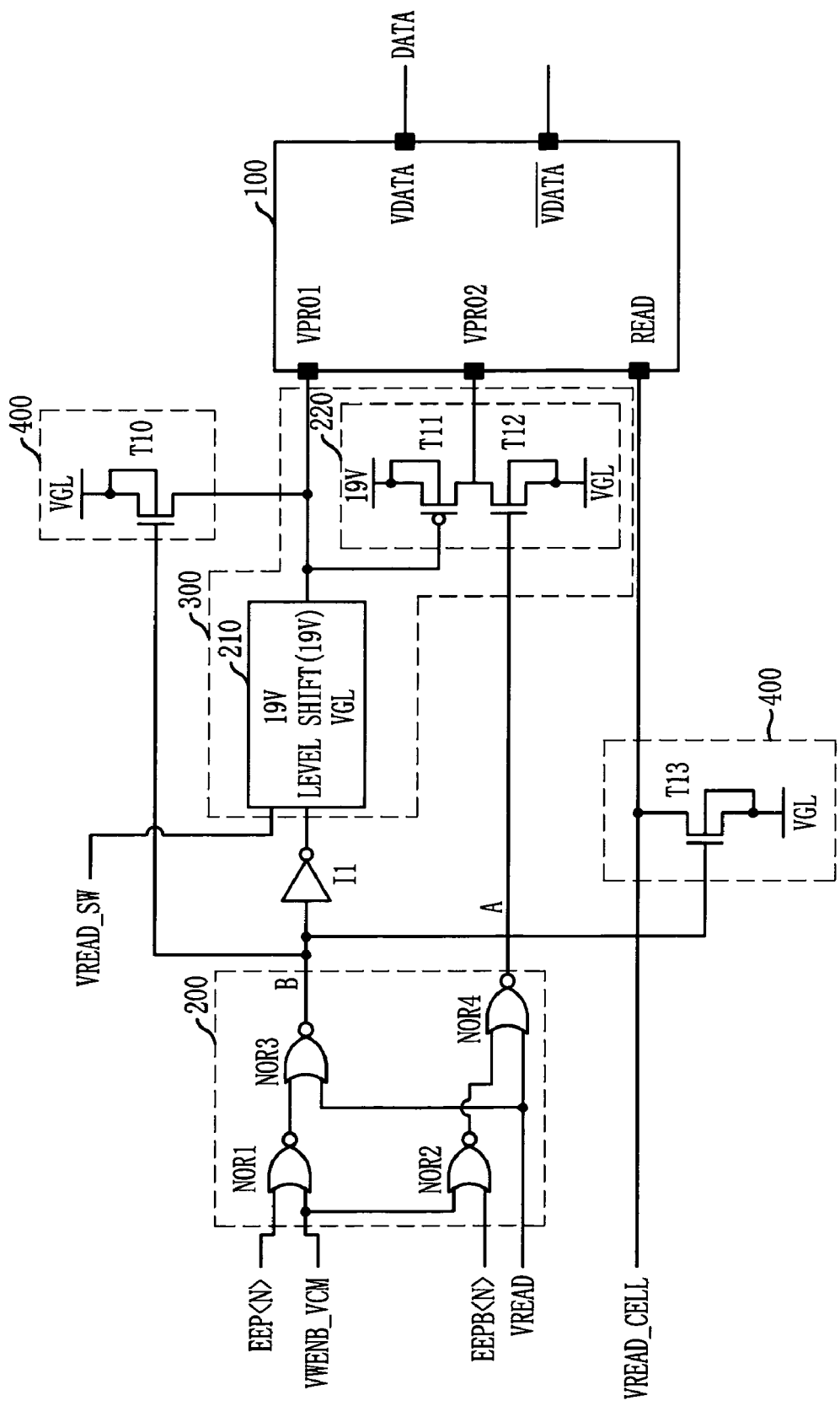
FIG. 4 is a schematic circuit diagram illustrating a control unit for controlling a unit cell of the semiconductor memory device of FIG. 2.

FIG. 4 is a circuit diagram illustrating a control unit for controlling the unit cell of the semiconductor memory device of FIG. 2. In FIG. 4, a unit cell block 100 represents the circuit of FIG. 2. Data signals EEP<N> and EEPB<N> are signals for transferring data to the unit cell block 100. A read command signal VREAD_CELL is provided as a read signal READ of the unit cell block 100, and a read enable signal VREAD is an enable signal of a data transfer unit 200 for performing a read operation.

Referring to FIG. 4, for control of the unit cell block 100, the control unit includes the data transfer unit 200 for receiving and transferring the data signals EEP<N> and EEPB<N>, and a programming control unit 300 for providing voltages corresponding to the data signals transferred from the data transfer unit 200 to nodes C and D of the unit cell block 100.

The programming control unit 300 includes the level shifter 210 and a programming voltage supply 220. The level shifter 210 shifts a signal VREAD_SW having a reference voltage level to a corresponding voltage level according to the data signal EEP<N> and transfers the level-shifted signal to the node C. The programming voltage supply 220 controls a voltage level of the node D in response to an output signal of the level shifter 210 and the data signal transferred from the data transfer unit 200. Enabling units 400 are further provided for controlling the transfer of signals VPR01, VPR02 and READ to the unit cell block 100.

In accordance with an embodiment of the present invention, the unit cell of the semiconductor memory device stores data using a difference between threshold voltages of two cross-coupled MOS transistors. Accordingly, even if a voltage level of a power voltage is low, data stored in the unit cell can be read at a high speed.

Furthermore, since the sensing unit and the unit cell each includes cross-coupled MOS transistors, current consumption in storing or reading data can be reduced as compared to the related art.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a sensing unit including first cross-coupled MOS transistors to sense and amplify a voltage difference between a first node and a second node;
   a unit cell including second cross-coupled cell MOS transistors to latch data and output a first signal and a second signal corresponding to the latched data to a third node and a fourth node, respectively; and a sensing protecting unit disposed between the sensing unit and the unit cell to protect the first cross-coupled MOS transistors of the sensing unit and output the signals applied to the third node and the fourth node to the first node and the second node, respectively, wherein the third node receives a first bias voltage and the fourth node receives a second bias voltage in order to provide an operation bias level of the unit cell.

2. The semiconductor memory device as recited in claim 1, wherein the second cross-coupled MOS transistors are more tolerant at a high voltage than the first cross-coupled MOS transistors.

3. The semiconductor memory device as recited in claim 1, further comprising an enabling unit configured to enable the unit cell in response to a read signal.

4. The semiconductor memory device as recited in claim 1, wherein the sensing unit includes:
a first MOS transistor having one terminal connected to a power supply voltage terminal, a gate connected to the second node, and the other terminal connected to the first node; and
a second MOS transistor having one terminal connected to the power supply voltage terminal, a gate connected to the first node, and the other terminal connected to the second node.

5. The semiconductor memory device as recited in claim 1, wherein the unit cell includes:
a first MOS transistor having one terminal connected to the third node and a gate connected to the fourth node; and
a second MOS transistor having one terminal connected to the fourth node and a gate connected to the third node.

6. The semiconductor memory device as recited in claim 1, wherein the sensing protecting unit includes:
a first MOS transistor connected between the first node and the third node and configured to connect the sensing unit and the unit cell in response to a read signal; and
a second MOS transistor connected between the second node and the fourth node and configured to connect the sensing unit and the unit cell in response to the read signal.

7. The semiconductor memory device as recited in claim 3, wherein the enabling unit includes:

a first MOS transistor disposed between one of the second cross-coupled MOS transistors and a ground voltage terminal; and
a second MOS transistor disposed between the other of the two cross-coupled MOS transistors and the ground voltage terminal.

8. A semiconductor memory device, comprising:
a sensing unit including first cross-coupled MOS transistors to sense and amplify a voltage difference between a first node and a second node;
a unit cell including second cross-coupled cell MOS transistors to latch data and output a first signal and a second signal corresponding to the latched data to a third node and a fourth node, respectively;
a sensing protecting unit disposed between the sensing unit and the unit cell to protect the first cross-coupled MOS transistors of the sensing unit and output the signals applied to the third node and the fourth node to the first node and the second node, respectively;
an enabling unit configured to enable the unit cell in response to a read signal;
a data transfer unit configured to transfer data signals; and
a programming control unit configured to supply a voltage corresponding to the data signals transferred from the data transfer unit to the third node and the fourth nodes
wherein the third node receives a first bias voltage and the fourth node receives a second bias voltage in order to provide an operation bias level of the unit cell.

9. The semiconductor memory device as recited in claim 8, wherein the programming control unit includes:
a level shifter configured to shift a signal having a reference voltage level to a corresponding voltage level according to the data signal and output the level-shifted signal to the third node; and
a programming voltage supply configured to control a voltage level of the fourth node in response to an output signal of the level shifter and the data signal transferred from the data transmitter.

10. The semiconductor memory device as recited in claim 9, wherein the level-shifted signal is the first bias voltage.

11. The semiconductor memory device as recited in claim 9, wherein the programming voltage supply controls a voltage level of the second bias voltage.

\* \* \* \* \*